(12) United States Patent
Tomura et al.

(10) Patent No.: US 11,196,271 B2
(45) Date of Patent: Dec. 7, 2021

(54) FULL-CHARGE-CAPACITY ESTIMATING DEVICE FOR POWER SUPPLY DEVICE

(71) Applicant: TOYOTA JIDOSHA KABUSHIKI KAISHA, Toyota (JP)

(72) Inventors: Shuji Tomura, Nagakute (JP); Shigeaki Goto, Nagakute (JP); Naoki Yanagizawa, Nagakute (JP); Kyosuke Tanemura, Nagakute (JP); Kazuo Ootsuka, Nagakute (JP); Junta Izumi, Nagoya (JP); Kenji Kimura, Miyoshi (JP); Toshihiro Katsuda, Toyota (JP); Kohei Matsuura, Anjo (JP); Takayuki Ban, Nishio (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 127 days.

(21) Appl. No.: 16/594,753

(22) Filed: Oct. 7, 2019

(65) Prior Publication Data

US 2020/0112183 A1 Apr. 9, 2020

(30) Foreign Application Priority Data

Oct. 9, 2018 (JP) .............................. JP2018-190710

(51) Int. Cl.
*H02J 7/00* (2006.01)
*G01R 31/392* (2019.01)
(52) U.S. Cl.
CPC .......... *H02J 7/0022* (2013.01); *G01R 31/392* (2019.01); *H02J 2007/0067* (2013.01)

(58) Field of Classification Search
CPC ............. H02J 7/0022; H02J 2007/0067; H02J 7/0049; H02J 7/0018; G01R 31/392; G01R 31/3842; G01R 31/396; G01R 31/387; Y02E 60/10; H01M 10/4207; H01M 10/425; H01M 10/4285; H01M 10/482; H01M 2010/4271
See application file for complete search history.

(56) References Cited

U.S. PATENT DOCUMENTS

| 10,459,037 B2 * | 10/2019 | Nishigaki | ........... H01M 10/425 |
| 2005/0269991 A1 * | 12/2005 | Mitsui | ................ G01R 31/3842 320/132 |
| 2011/0161025 A1 | 6/2011 | Tomura et al. | |

(Continued)

FOREIGN PATENT DOCUMENTS

| CN | 105143898 A | * 12/2015 | ............ H01M 10/48 |
| EP | 1314992 A2 | 5/2003 | |

(Continued)

*Primary Examiner* — Stacy Whitmore
(74) *Attorney, Agent, or Firm* — Oliff PLC

(57) ABSTRACT

Provided is a full-charge-capacity estimating device that has one or more of a plurality of battery modules, as battery-modules-to-be-measured, charged or discharged by means of a first switch element and a second switch element according to whether a power supply device is in a powering state or a regenerating state, measures an integrated current value and a change in the state-of-charge of the battery-module-to-be-measured, and then estimates the full charge capacity of the battery-module-to-be-measured from the integrated current value and the change in the state-of-charge.

9 Claims, 10 Drawing Sheets

(56) References Cited

U.S. PATENT DOCUMENTS

| | | | | |
|---|---|---|---|---|
| 2013/0320989 A1* | 12/2013 | Inoue | | B60L 58/16 324/427 |
| 2014/0021923 A1 | 1/2014 | Uchida | | |
| 2014/0177145 A1* | 6/2014 | Kawahara | | H01M 10/486 361/679.01 |
| 2015/0127280 A1* | 5/2015 | Baba | | G01R 31/382 702/63 |
| 2017/0338668 A1* | 11/2017 | Sada | | H02J 7/007194 |
| 2018/0017628 A1* | 1/2018 | Takegami | | G01R 31/3648 |
| 2018/0313905 A1* | 11/2018 | Takahashi | | G01R 31/367 |
| 2018/0313906 A1* | 11/2018 | Takahashi | | G01R 31/378 |
| 2019/0027784 A1* | 1/2019 | Nose | | H01M 10/0525 |
| 2019/0113581 A1* | 4/2019 | Kawamura | | G01R 31/382 |
| 2019/0143838 A1* | 5/2019 | Sun | | H01M 10/486 320/124 |
| 2019/0178948 A1* | 6/2019 | Takahashi | | G01R 31/374 |
| 2019/0181510 A1* | 6/2019 | Takahashi | | H01M 10/052 |
| 2020/0047634 A1* | 2/2020 | Akaishi | | B60L 58/20 |
| 2020/0076206 A1 | 3/2020 | Goto et al. | | |
| 2020/0124676 A1* | 4/2020 | Tohara | | H02J 7/0048 |
| 2020/0292619 A1* | 9/2020 | Tohara | | G01R 31/3828 |
| 2021/0013555 A1* | 1/2021 | Pol | | H01M 10/0525 |
| 2021/0048482 A1* | 2/2021 | Ukumori | | G01R 31/36 |
| 2021/0074048 A1* | 3/2021 | Namiki | | G07C 5/0825 |

FOREIGN PATENT DOCUMENTS

| | | | | |
|---|---|---|---|---|
| JP | 2003-224901 A | 8/2003 | | |
| JP | 2010-060384 A | 3/2010 | | |
| JP | 2013-179739 A | 9/2013 | | |
| JP | 2014-023361 A | 2/2014 | | |
| JP | 2018-074709 A | 5/2018 | | |
| WO | WO-2014083856 A1 * | 6/2014 | | G01R 31/367 |
| WO | WO-2016038873 A1 * | 3/2016 | | G01R 31/3842 |
| WO | WO-2016129212 A1 * | 8/2016 | | B60W 10/26 |
| WO | 2018/079664 A1 | 5/2018 | | |
| WO | 2018/179774 A1 | 10/2018 | | |

* cited by examiner

FULL-CHARGE-CAPACITY ESTIMATING DEVICE FOR POWER SUPPLY DEVICE

INCORPORATION BY REFERENCE

The disclosure of Japanese Patent Application No. 2018-190710 filed on Oct. 9, 2018 including the specification, drawings and abstract is incorporated herein by reference in its entirety.

BACKGROUND

1. Technical Field

The present disclosure relates to a full-charge-capacity estimating device for a power supply device.

2. Description of Related Art

Power supply devices that have a plurality of battery modules connected in series to supply a load with electric power (power a load) are used. When the batteries included in the battery modules are secondary batteries, the power supply device can also charge these batteries from the load side (regenerate electric power).

For such power supply devices, a configuration including a switching circuit that connects and isolates the battery module to and from a load based on a gate signal has been proposed. In this circuit configuration, voltage control is performed by driving the switching circuit of each battery module through a gate signal via a delay circuit. A technique of resolving imbalance in the state-of-charge (SOC) among battery modules by providing a balance circuit in each battery module has also been proposed (Japanese Patent Application Publication No. 2013-179739).

It is known that the capacity of a secondary battery upon full charge (hereinafter referred to as a full charge capacity) decreases as a result of repeated charge and discharge. In this connection, a method has been disclosed in which the SOC of a secondary battery that has been repeatedly charged and discharged is obtained based on an integrated current value and an open-circuit voltage thereof, and the full charge capacity is estimated from the SOC (Japanese Patent Application Publication No. 2003-224901). In another method having been disclosed, the internal state of a secondary battery is estimated according to battery model formulae; the SOC and the battery current are estimated based on the estimation result; the battery current and the SOC are acquired; and a capacity deterioration parameter is estimated such that the rate of change in error (estimation error) between an actual integrated current value and an estimated integrated current value relative to the SOC is minimized (Japanese Patent Application Publication No. 2010-060384).

SUMMARY

These related arts do not suggest a method to estimate the full charge capacity of a power supply device that includes a battery pack having battery cells or battery modules connected in series.

When these related arts are applied to a power supply device that includes a battery pack having battery cells or battery modules connected in series, all the batteries (cells or modules) are charged or discharged, resulting in a change in the SOC. The input and output performance of a battery depends on the SOC; generally, the output performance is lower at a lower SOC and the input performance is lower at a higher SOC. Thus, a change in the SOC causes degradation of the input or output performance of the battery pack, so that the performance of the battery pack as an electric power buffer may be sacrificed during estimation of the full charge capacity.

One aspect of the present disclosure is a full-charge-capacity estimating device for a power supply device that includes a plurality of battery modules each having a secondary battery. The battery modules are connected in series with one another according to a gate signal, and the power supply device is equipped with a disconnecting device that forcibly isolates a battery module from the series connection regardless of the gate signal. The disconnecting device causes one or more of the battery modules to be charged or discharged, as battery-modules-to-be-measured, according to whether the power supply device is in a powering state or a regenerating state such that an integrated current value ΔAh and a change in a state-of-charge ΔSOC of each battery-module-to-be-measured are measured, and the full charge capacity of the battery-module-to-be-measured is then estimated from the integrated current value ΔAh and the change in the state-of-charge ΔSOC.

Here, while an output of the power supply device is in a powering state, the full-charge-capacity estimating device may perform control so as to forcibly isolate the battery-module-to-be-measured from the series connection by the disconnecting device such that the battery-module-to-be-measured has a smaller integrated amount of discharged current per unit time than the other battery modules.

While an output of the power supply device is in a regenerating state, the full-charge-capacity estimating device may perform control so as to forcibly isolate the battery-module-to-be-measured from the series connection by the disconnecting device such that the battery-module-to-be-measured has a smaller integrated amount of charged current per unit time than the other battery modules.

Another aspect of the present disclosure is a full-charge-capacity estimating device for a power supply device that includes a plurality of battery modules each having a secondary battery. The battery modules are connected in series with one another according to a gate signal, and the power supply device is equipped with a connecting device that forcibly connects a battery module to the series connection regardless of the gate signal. The connecting device causes one or more of the battery modules to be charged or discharged, as battery-modules-to-be-measured, according to whether the power supply device is in a powering state or a regenerating state such that an integrated current value ΔAh and a change in a state-of-charge ΔSOC of each battery-module-to-be-measured are measured, and the full charge capacity of the battery-module-to-be-measured is then estimated from the integrated current value ΔAh and the change in the state-of-charge ΔSOC.

Here, while an output of the power supply device is in a regenerating state, the full-charge-capacity estimating device may perform control so as to forcibly connect the battery-module-to-be-measured to the series connection by the connecting device such that the battery-module-to-be-measured has a larger integrated amount of charged current per unit time than the other battery modules.

While an output of the power supply device is in a powering state, the full-charge-capacity estimating device may perform control so as to forcibly connect the battery-module-to-be-measured to the series connection by the connecting device such that the battery-module-to-be-measured has a larger integrated amount of discharged current per unit time than the other battery modules.

To measure the change in the state-of-charge ΔSOC corresponding to the integrated current value ΔAh, the full-charge-capacity estimating device may measure an open-circuit voltage OCV of the battery-module-to-be-measured and obtain the change in the state-of-charge ΔSOC corresponding to the open-circuit voltage OCV.

The present disclosure makes it possible to estimate the full charge capacities of battery modules individually with high accuracy while avoiding degrading the input and output performance of the power supply circuit.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
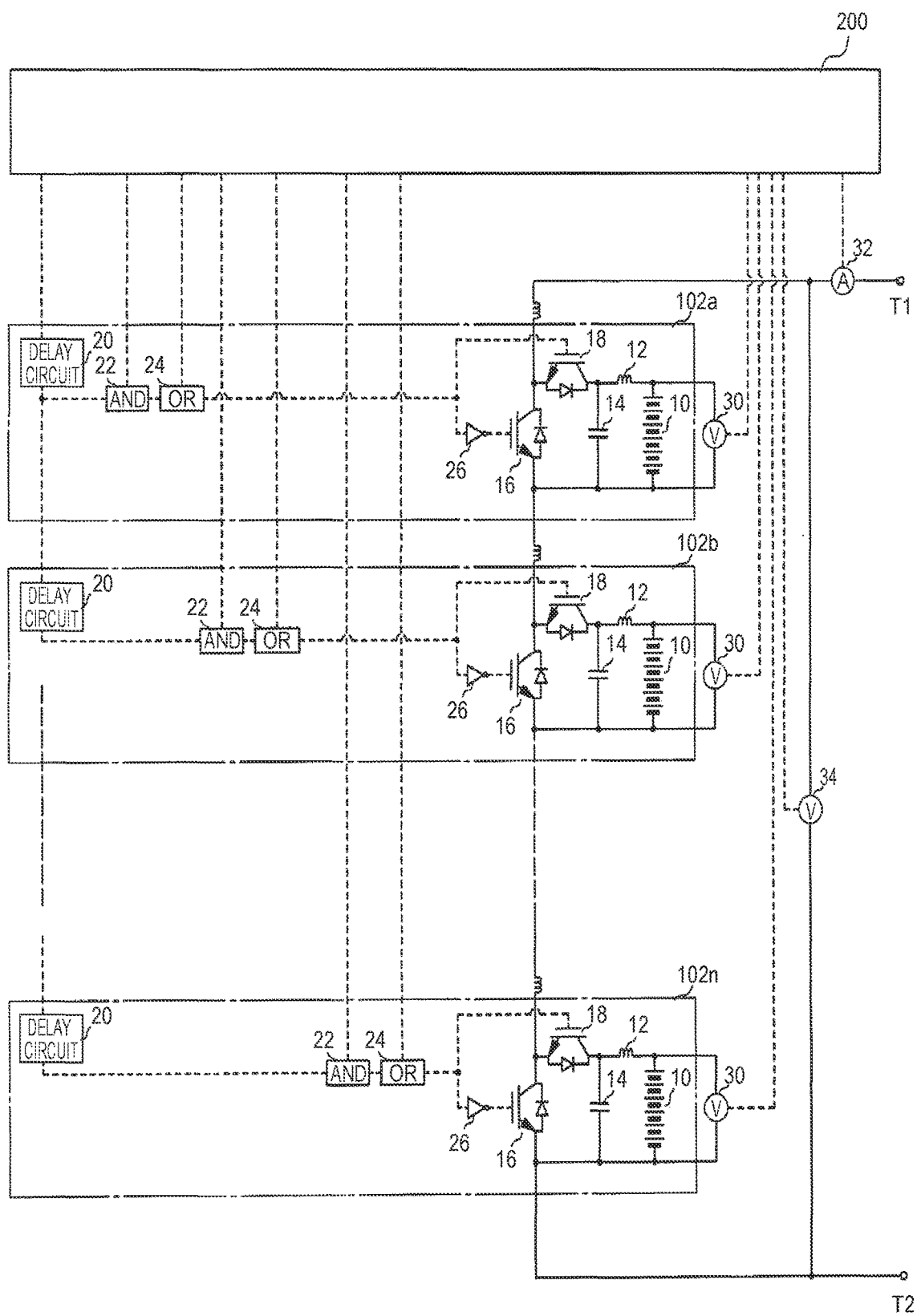
FIG. 1 is a diagram showing the configuration of a power supply device and a full-charge-capacity estimating device in an embodiment of the present disclosure.

As shown in FIG. 1, a power supply device 100 that is an object in an embodiment includes battery modules 102. The power supply device 100 includes a plurality of battery modules 102 (102a, 102b, . . . 102n). The battery modules 102 can be connected in series with one another. The battery modules 102 included in the power supply device 100 can supply a load (not shown) connected to terminals T1, T2 with electric power (power the load), or can be charged with electric power from a power source (not shown) connected to the terminals T1, T2 (regenerate electric power).

As shown in FIG. 1, a full-charge-capacity estimating device 200 in the embodiment is connected to the power supply device 100. The full-charge-capacity estimating device 200 performs a process of forcibly disconnecting or connecting one or more of the battery modules 102 of the power supply device 100 as battery-modules-to-be-measured 102 and estimating the full charge capacities of the battery-modules-to-be-measured 102.

First, the configuration of the power supply device 100 will be described. The battery module 102 includes a battery 10, a choke coil 12, a capacitor 14, a first switch element 16, a second switch element 18, a delay circuit 20, an AND element 22, an OR element 24, and a NOT element 26. In this embodiment, the battery modules 102 have the same configuration.

The battery 10 includes at least one secondary battery. For example, the battery 10 can have a configuration in which a plurality of lithium-ion batteries, nickel-metal hydride batteries, or the like is connected in series or parallel. The choke coil 12 and the capacitor 14 form a smoothing circuit (low-pass filter circuit) that smoothes an output from the battery 10 and outputs the smoothed output. That is, a secondary battery is used as the battery 10, and the battery 10 deteriorates as the internal resistance loss increases. To reduce such deterioration, the current is smoothed by an RLC filter formed by the battery 10, the choke coil 12, and the capacitor 14.

However, the choke coil 12 and the capacitor 14 are not essential components and may be omitted. In the battery module 102, the positions at which the choke coil 12 and the battery 10 are disposed (connected) may be interchanged with each other. The second switch element 18 may be disposed on the opposite side of an output terminal from the first switch element 16. In short, the arrangement of the elements and electric components can be changed as appropriate, as long as the configuration allows the voltage of the battery 10 (capacitor 14) to be output to the output terminal by switching actions of the first switch element 16 and the second switch element 18.

The first switch element 16 includes a switching element for short-circuiting the output terminal of the battery 10. In this embodiment, the first switch element 16 has a configuration in which a freewheeling diode is connected in parallel to a field-effect transistor that is a switching element. The second switch element 18 is connected in series with the battery 10 between the battery 10 and the first switch element 16. In this embodiment, the second switch element 18 has a configuration in which a freewheeling diode is connected in parallel to a field-effect transistor that is a switching element. Switching of the first switch element 16 and the second switch element 18 is controlled through a gate signal from the full-charge-capacity estimating device 200. While field-effect transistors are used in the first switch element 16 and the second switch element 18 in this embodiment, other switching elements may also be used.

The delay circuit 20 is a circuit that delays the gate signal input from the full-charge-capacity estimating device 200 into the battery module 102a by a predetermined time. In the power supply device 100, the delay circuits 20 are respectively provided in the battery modules 102 (102a, 102b, . . . 102n) and connected in series with one another. Therefore, the gate signal input from the full-charge-capacity estimating device 200 is sequentially input into the battery modules 102 (102a, 102b, . . . 102n) while being delayed by a predetermined time at each battery module 102.

The AND element 22 constitutes a disconnecting device that forcibly isolates the battery module 102a from the series connection according to a forced disconnection signal from the full-charge-capacity estimating device 200. The OR element 24 constitutes a connecting device that forcibly connects the battery module 102a to the series connection according to a forced connection signal from the full-charge-capacity estimating device 200.

While the delay circuit 20 is disposed upstream of the AND element 22 and the OR element 24 in this embodiment, the delay circuit 20 may instead be disposed downstream of the AND element 22 and the OR element 24. Any configuration can be adopted that allows the gate signal to be sequentially transmitted to the delay circuits 20 of the respective battery modules 102 while being delayed by a predetermined time at each battery module 102.

Normal Control

Control of the power supply device 100 will be described below with reference to FIG. 2. During normal control, a high (H)-level forced disconnection signal is input from the full-charge-capacity estimating device 200 into the AND element 22 of each of the battery modules 102 (102a, 102b, . . . 102n). A low (L)-level forced connection signal is input from the full-charge-capacity estimating device 200 into the OR element 24 of each of the battery modules 102 (102a, 102b, . . . 102n). As a result, an output signal from the delay circuit 20 is input as an inverted signal into the gate terminal of the first switch element 16 through the NOT element 26, while an output signal from the delay circuit 20 is input as is into the gate terminal of the second switch element 18.

Figure 2:
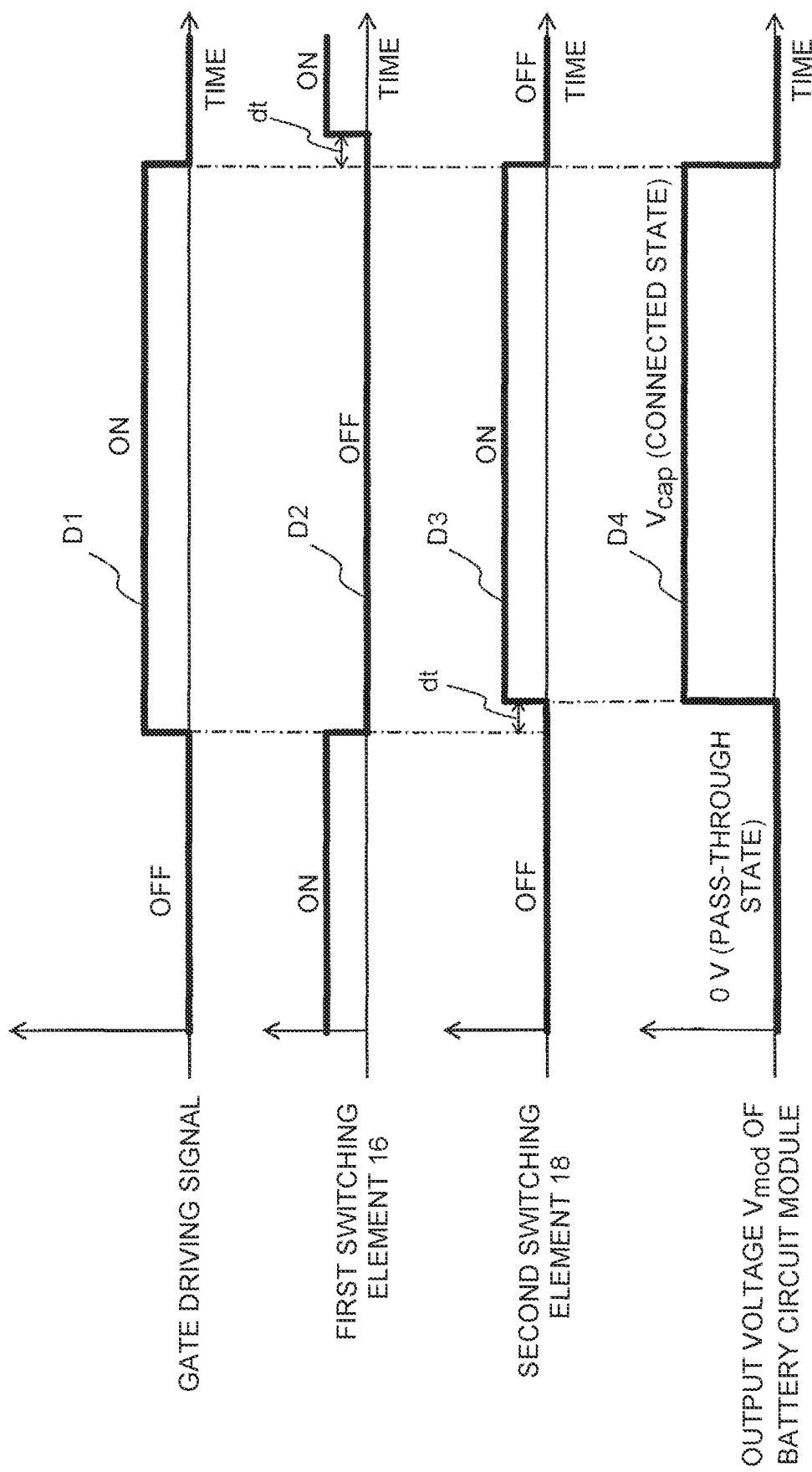
FIG. 2 is a time chart illustrating control of a battery module in the embodiment of the present disclosure.

FIG. 2 is a time chart relating to the operation of the battery module 102a. FIG. 2 shows a pulse waveform of a gate signal D1 that drives the battery module 102a, a rectangular wave D2 representing the switching state of the first switch element 16, a rectangular wave D3 representing the switching state of the second switch element 18, and a waveform D4 of a voltage $V_{mod}$ output from the battery module 102a.

In an initial state of the battery module 102a, i.e., in a state where the gate signal is not being output, the first switch element 16 is on and the second switch element 18 is off. When the gate signal is input from the full-charge-capacity estimating device 200 into the battery module 102a, switching of the battery module 102a is controlled by PWM control. Under this switching control, the first switch element 16 and the second switch element 18 are switched so as to be alternately turned on and off.

As shown in FIG. 2, when the gate signal D1 is output from the full-charge-capacity estimating device 200, the first switch element 16 and the second switch element 18 of the battery module 102a are driven according to the gate signal D1. The first switch element 16 switches from an on state to an off state as the signal from the NOT element 26 falls in response to a rise of the gate signal D1. The first switch element 16 switches from an off state to an on state with a delay of a short time (dead time dt) after a fall of the gate signal D1.

On the other hand, the second switch element 18 switches from an off state to an on state with a delay of a short time (dead time dt) after a rise of the gate signal D1. The second switch element 18 switches from an on state to an off state at the same time that the gate signal D1 falls. Thus, switching of the first switch element 16 and the second switch element 18 is controlled such that these switch elements are alternately turned on and off.

It is to prevent the first switch element 16 and the second switch element 18 from being activated at the same time, that the first switch element 16 is activated with a delay of a short time (dead time dt) after a fall of the gate signal D1, and that the second switch element 18 is activated with a delay of a short time (dead time dt) after a rise of the gate signal D1. Thus, short-circuit resulting from the first switch element 16 and the second switch element 18 turning on at the same time is prevented. The dead time dt that causes a delay in activation is set to 100 ns, for example, but can be set to any appropriate time. During the dead time dt, a current is circulated through the diode, which creates the same state as when a switching element parallel to this diode through which a current circulates is turned on.

Figure 3A:
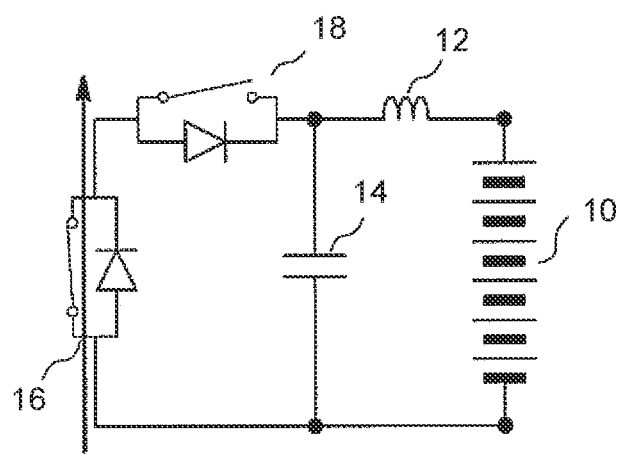
FIG. 3A is a diagram showing the operation of the battery module in the embodiment of the present disclosure.

In the battery module 102a thus controlled, the capacitor 14 is isolated from the output terminal of the battery module 102a when the gate signal D1 is off (i.e., the first switch element 16 is on and the second switch element 18 is off). Therefore, no voltage is output from the battery module 102a to the output terminal. In this state, the battery module 102a is in a pass-through state in which the battery 10 (capacitor 14) thereof is bypassed as shown in FIG. 3A.

Figure 3B:
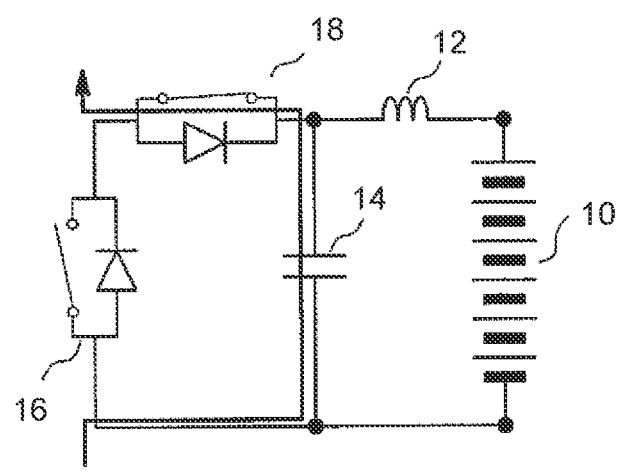
FIG. 3B is a diagram showing the operation of the battery module in the embodiment of the present disclosure.

The capacitor 14 is connected to the output terminal of the battery module 102a when the gate signal D1 is on (i.e., the first switch element 16 is off and the second switch element 18 is on). Thus, a voltage is output from the battery module 102a to the output terminal. In this state, the voltage $V_{mod}$ is output to the output terminal through the capacitor 14 of the battery module 102a as shown in FIG. 3B.

Referring back to FIG. 1, control of the power supply device 100 by the full-charge-capacity estimating device 200 will be described. The full-charge-capacity estimating device 200 controls all the battery modules 102. By controlling the battery modules 102a, 102b, . . . 102n, the full-charge-capacity estimating device 200 controls the output voltage of the power supply device 100 as a whole.

The full-charge-capacity estimating device 200 includes a gate circuit that outputs the gate signal with a rectangular waveform to each battery module 102. The gate signal is sequentially transmitted to the delay circuit 20 included in the battery module 102a, the delay circuit 20 included in the battery module 102b, and so on to the subsequent other battery modules 102. Specifically, the gate signal is sequentially transmitted to the battery modules 102 connected in series in the power supply device 100, from a most upstream side toward a downstream side, while being delayed by a predetermined delay time at each battery module 102.

During normal control, a high (H)-level forced disconnection signal is input from the full-charge-capacity estimating device 200 into the AND element 22, and a low (L)-level forced connection signal is input from the full-charge-capacity estimating device 200 into the OR element 24, so that the gate signal output from the delay circuit 20 of each battery module 102 is input as is into the gate terminal of the second switch element 18, while an inverted signal of the gate signal is input into the gate terminal of the first switch element 16. Thus, when the gate signal level is high (H), the first switch element 16 is turned off and the second switch element 18 is turned on, and when the gate signal level is low (L), the first switch element 16 is turned on and the second switch element 18 is turned off.

In other words, when the gate signal level is high (H), the battery module 102 is put in a state of being connected in series with the other battery modules 102, and when the gate signal level is low (L), the battery module 102 is put in a pass-through state of being isolated from the other battery modules 102.

Figure 4:
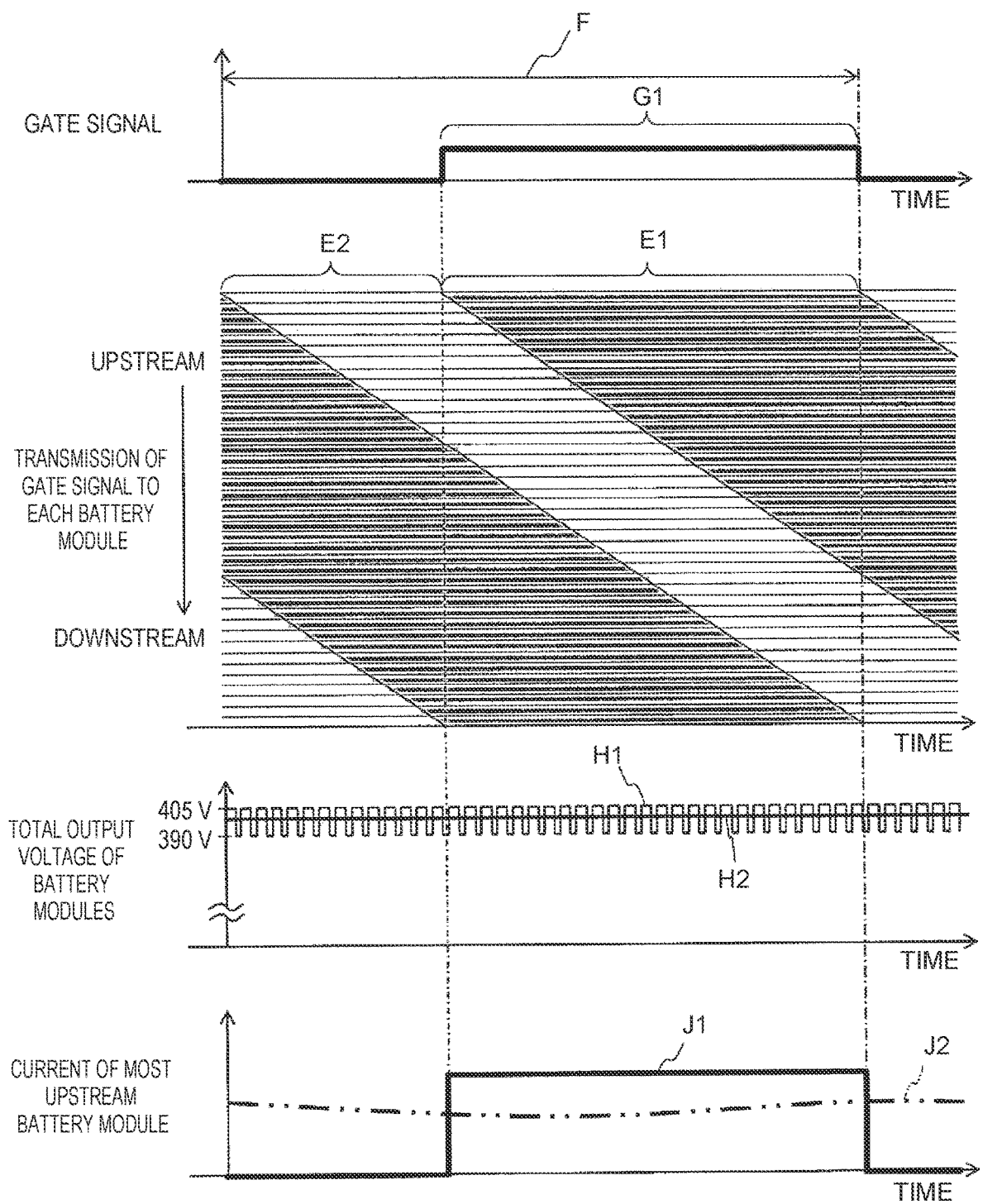
FIG. 4 is a time chart illustrating control of the power supply device in the embodiment of the present disclosure.

FIG. 4 shows a sequence of control under which electric power is output by sequentially connecting in series a predetermined number of battery modules among the battery modules 102a, 102b, . . . 102n. As shown in FIG. 4, the battery modules 102a, 102b, . . . 102n are driven according to the gate signal, one after another from an upstream side toward a downstream side, each with a delay of a certain time. In FIG. 4, a period E1 represents a state in which the first switch elements 16 are off and the second switch elements 18 are on in the battery modules 102a, 102b, . . . 102n, and the battery modules 102a, 102b, . . . 102n are outputting a voltage from the output terminals (connected state). A period E2 represents a state in which the first switch elements 16 are on and the second switch elements 18 are off in the battery modules 102a, 102b, . . . 102n, and the battery modules 102a, 102b, . . . 102n are not outputting a voltage from the output terminals (pass-through state). Thus, the battery modules 102a, 102b, . . . 102n are sequentially driven, each with a delay of a certain time.

Settings of the gate signal and the delay time of the gate signal will be described with reference to FIG. 4. A cycle F of the gate signal is set by adding up the delay times of the respective battery modules 102a, 102b, . . . 102n. Therefore, setting a longer delay time results in a lower frequency of the gate signal. Conversely, setting a shorter delay time results in a higher frequency of the gate signal. The delay time by which the gate signal is delayed can be appropriately set according to the required specifications of the power supply device 100.

An on-time ratio G1 (duty ratio D) during the cycle F of the gate signal, i.e., a ratio of a time for which the gate signal is at a high (H) level relative to the cycle F, is calculated by: the output voltage of the power supply device 100/the total voltage of the battery modules 102a, 102b, . . . 102n (the battery voltage of the battery module 102×the number of the battery modules). Thus, the on-time ratio G1=(the output voltage of the power supply device 100)/(the battery voltage of the battery module 102×the total number of the battery modules 102). To be exact, the on-time ratio deviates by an amount corresponding to the dead time dt, and therefore it is preferable to correct the on-time ratio by feed-back or feed-forward, as commonly practiced for chopper circuits.

As described above, the total voltage of the battery modules 102a, 102b, . . . 102n is represented by a value obtained by multiplying the battery voltage of the battery module 102 by the number of the battery modules 102 in the connected state. If the output voltage of the power supply device 100 has a value that can be evenly divided by the battery voltage of one battery module 102, the moment one battery module 102 switches from the pass-through state to the connected state, another battery module 102 switches from the connected state to the pass-through state, so that the total output voltage of the battery modules 102 does not vary.

However, if the output voltage of the power supply device 100 has a value that cannot be evenly divided by the battery voltage of the battery module 102, the output voltage of the power supply device 100 and the total voltage of the battery modules 102a, 102b, . . . 102n do not match with each other. In other words, the output voltage of the power supply device 100 (the total output voltage) varies. In this case, the amplitude of the variation corresponds to the voltage of one battery module, and the period of the variation corresponds to: the cycle F of the gate signal/the number of the battery modules 102. Connecting several tens of battery modules 102 in series can make the value of parasitic inductance in the entire power supply device 100 large, so that this voltage variation is filtered out and consequently the power supply device 100 can produce a stable output voltage.

Next, a specific example will be described. In FIG. 4, it is assumed, for example, that the desired output voltage of the power supply device 100 as a whole is 400 V; the battery voltage of each battery module 102 is 15 V; the number of the battery modules 102a, 102b, . . . 102n is 40; and the delay time is 200 ns. This case corresponds to a case where the output voltage (400 V) of the power supply device 100 cannot be evenly divided by the battery voltage (15 V) of the battery module 102.

Based on these numerical values, the cycle F of the gate signal is calculated by the delay time×the number of the battery modules as follows: 200 ns×40=8 μs. Therefore, the gate signal is a rectangular wave with a frequency equivalent to 125 kHz. The on-time ratio G1 of the gate signal is calculated by the output voltage of the power supply device 100/(the battery voltage of the battery module 102×the number of the battery modules 102) as follows: 400 V/(15 V×40)=0.67.

When the battery modules 102a, 102b, . . . 102n are sequentially driven based on these numerical values, an output voltage H1 with a rectangular waveform in FIG. 4 is produced by the power supply device 100 as a whole. This output voltage H1 varies between 390 V and 405 V. Specifically, the output voltage H1 varies in cycles calculated by: the cycle F of the gate signal/the number of the battery modules, i.e., 8 μs/40=200 ns (equivalent to 5 MHz). This variation is filtered out by the parasitic inductance due to the wiring of the battery modules 102a, 102b, . . . 102n, so that the power supply device 100 as a whole produces an output voltage H2 of about 400 V.

A current flows through the capacitor 14 of each battery module 102 when the battery module 102 is in the connected state, and a capacitor current waveform J1 is a rectangular waveform as shown in FIG. 4. Since the battery 10 and the capacitor 14 form an RLC filter, a current J2 that has been filtered and smoothed flows through the power supply device 100. Thus, the current waveform is uniform in all the battery modules 102a, 102b, . . . 102n, and a current can be output evenly from all the battery modules 102a, 102b, . . . 102n.

As has been described above, to control the power supply device 100, the gate signal output to the most upstream battery module 102a is output to the downstream battery module 102b with a delay of a certain time, and this gate signal is further sequentially transmitted to the downstream battery modules 102, each time with a delay of a certain time, so that the battery modules 102a, 102b, . . . 102n sequentially output a voltage, each with a delay of a certain time. These voltages are added up to a voltage that is output from the power supply device 100 as a whole. Thus, a desired voltage can be output from the power supply device 100.

While this embodiment has adopted the configuration in which the delay circuit 20 is provided in each battery module 102 and the gate signal is transmitted while being delayed, the present disclosure is not limited to this configuration. For example, a configuration in which the delay circuit 20 is not provided in each battery module 102 may be adopted. In this case, the gate signal can be separately output from the full-charge-capacity estimating device 200 to the AND element 22 and the OR element 24 of each battery module 102. Specifically, the gate signal is output from the full-charge-capacity estimating device 200 to the battery modules 102a, 102b, . . . 102n at regular time intervals. In this case, the number of those of the battery modules 102a, 102b, . . . 102n that are put in the connected state is controlled by outputting the gate signal to the battery modules 102*a*, 102*b*, . . . 102*n* in an arbitrary order at regular time intervals, regardless of the positions of the battery modules 102*a*, 102*b*, . . . 102*n*. For example, this control can be performed such that the gate signal is first output to the battery module 102*b* to drive the battery module 102*b*, and after a certain time, the gate signal is output to the battery module 102*a* to drive the battery module 102*a*.

This configuration can eliminate the need for the delay circuit 20. Thus, the configuration of the power supply device 100 can be further simplified, and the manufacturing cost and electric power consumption can be reduced.

Forced Isolation Control

Next, control of forcibly isolating a selected one or selected ones of the battery modules 102 (102*a*, 102*b*, . . . 102*n*) will be described. The full-charge-capacity estimating device 200 outputs a low (L)-level forced disconnection signal to the AND element 22 of the battery module 102 to be forcibly isolated. On the other hand, the full-charge-capacity estimating device 200 outputs a low (L)-level forced connection signal to the OR element 24 of this battery module 102.

As a result, a low (L) level is output from the AND element 22, and through the OR element 24, a high (H) level is input into the gate terminal of the first switch element 16 by the NOT element 26 and a low (L) level is input into the gate terminal of the second switch element 18. Thus, the first switch element 16 is put in a normally on state and the second switch element 18 is put in a normally off state, which puts the battery module 102 in a state of being forcibly isolated regardless of the state of the gate signal (pass-through state).

Figure 5:
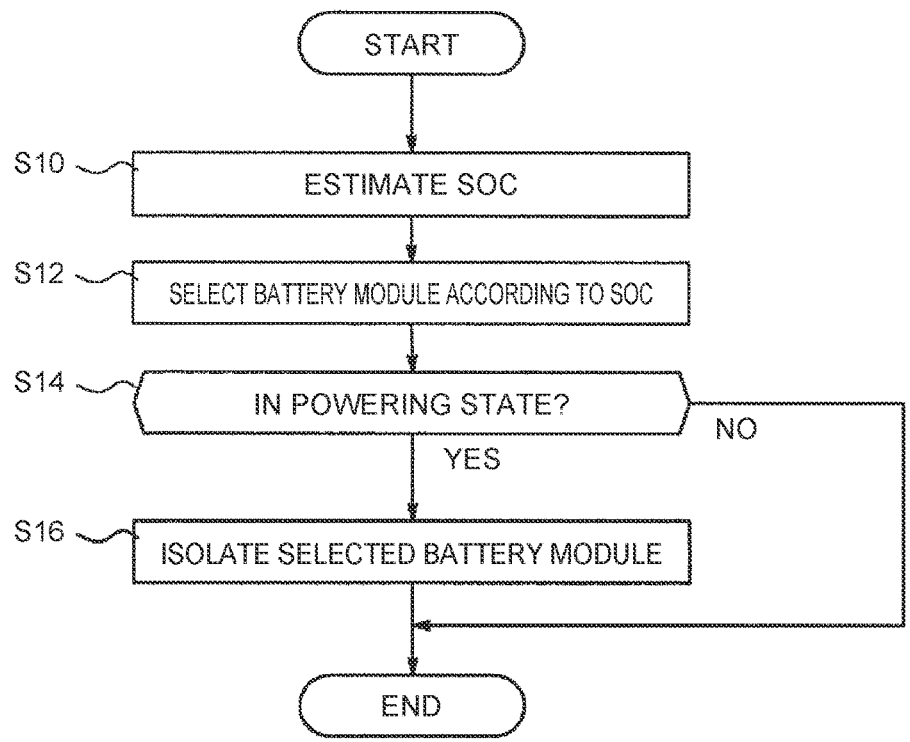
FIG. 5 is a flowchart of forced disconnection control in a powering state in the embodiment of the present disclosure.

Such forced isolation control can be used as control for reducing imbalance in the SOC among the battery modules 102 in the power supply device 100. FIG. 5 is a flowchart of SOC balance adjusting control. In the following, control for reducing imbalance in the SOC among the battery modules 102 in a powering state will be described with reference to FIG. 5.

In step S10, the states-of-charge of all the battery modules 102 included in the power supply device 100 are estimated. The full-charge-capacity estimating device 200 performs a process of estimating the SOC of each battery module 102 based on outputs from a voltage sensor 30 that is provided in each battery module 102 and detects and outputs an output voltage of the battery module 102, a current sensor 32 that detects and outputs an output current of the power supply device 100, and a voltage sensor 34 that detects and outputs an output voltage of the power supply device 100. The process of estimating the SOC will be described later.

In step S12, the states-of-charge of the battery modules 102 are compared and a battery module 102 with a relatively low SOC is selected. The full-charge-capacity estimating device 200 compares the states-of-charge of the battery modules 102 estimated in step S10, and selects a battery module 102 with a relatively low SOC from all the battery modules 102.

For example, a predetermined number of battery modules 102 may be selected in increasing order of the SOC from all the battery modules 102 included in the power supply device 100. Alternatively, a reference value for the SOC may be determined in advance, and a battery module 102 of which the SOC is equal to or lower than this reference value may be selected. However, the method of selecting the battery modules 102 is not limited to these examples, and any method that is effective in reducing imbalance in the SOC can be used.

In step S14, it is determined whether the electric power output of the power supply device 100 is in a powering state or a regenerating state. The full-charge-capacity estimating device 200 determines, from the direction of the current detected by the current sensor 32, whether the power supply device 100 is in the powering state in which electric power is supplied from the power supply device 100 to a load or in the regenerating state in which electric power is input from an external power source into the power supply device 100. The full-charge-capacity estimating device 200 moves to step S16 if the power supply device 100 is in the powering state, and ends the process if the power supply device 100 is in the regenerating state.

In step S16, the process of forcibly isolating the battery module 102 is performed. The full-charge-capacity estimating device 200 outputs a low (L)-level forced disconnection signal to the AND element 22 of the battery module 102 selected in step S12. As a result, the selected battery module 102 is forcibly isolated from the series connection and stops contributing to the output of the power supply device 100.

This control can resolve the imbalance in the SOC as the amount of electric power consumed in a battery module 102 with a relatively low SOC among the battery modules 102 included in the power supply device 100 (an integrated amount of discharged current per unit time) is reduced. As a result, energy charged to all the battery modules 102 included in the power supply device 100 can be efficiently used up.

The control for resolving imbalance in the SOC can also be performed while the power supply device 100 is in the regenerating state and not in the powering state. In this case, control of forcibly isolating a battery module 102 with a relatively high SOC is performed, and a battery module 102 with a relatively low SOC is preferentially charged with regenerated electric power, to thereby resolve imbalance in the SOC.

Figure 6:
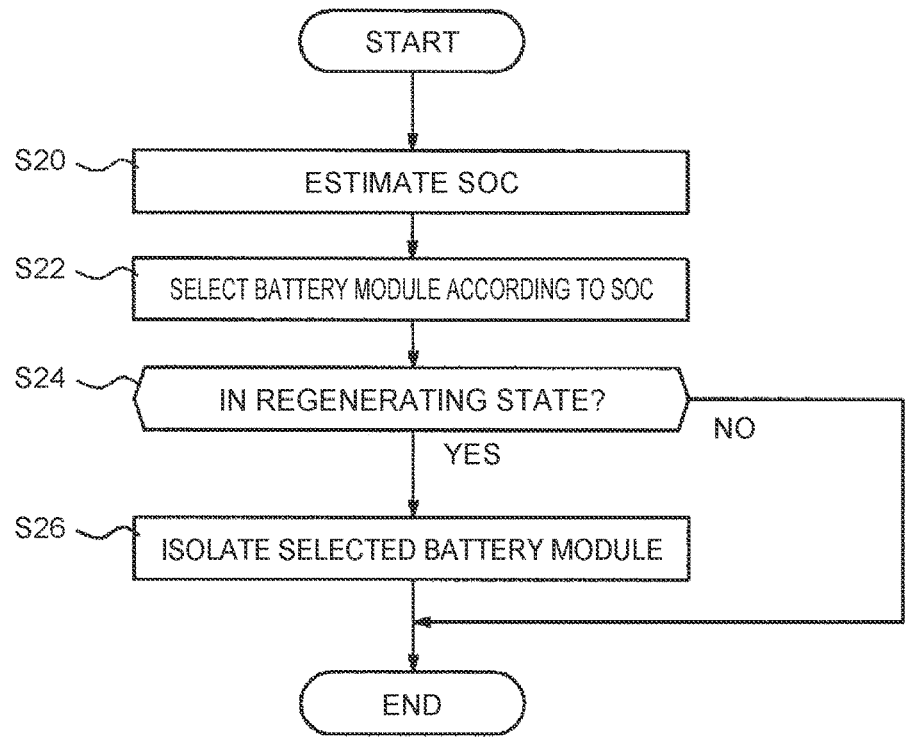
FIG. 6 is a flowchart of forced disconnection control in a regenerating state in the embodiment of the present disclosure.

FIG. 6 is a flowchart of SOC balance adjusting control. In the following, control for reducing imbalance in the SOC among the battery modules 102 in the regenerating state will be described with reference to FIG. 6.

In step S20, the states-of-charge of all the battery modules 102 included in the power supply device 100 are estimated. The full-charge-capacity estimating device 200 performs a process of estimating the SOC of each battery module 102 based on outputs from the voltage sensor 30 that is provided in each battery module 102 and detects and outputs an output voltage of the battery module 102, the current sensor 32 that detects and outputs an output current of the power supply device 100, and the voltage sensor 34 that detects and outputs an output voltage of the power supply device 100. The process of estimating the SOC will be described later.

In step S22, the states-of-charge of the battery modules 102 are compared and a battery module 102 with a relatively high SOC is selected. The full-charge-capacity estimating device 200 compares the states-of-charge of the battery modules 102 estimated in step S20, and selects a battery module 102 with a relatively high SOC from all the battery modules 102.

For example, a predetermined number of battery modules 102 may be selected in decreasing order of the SOC from all the battery modules 102 included in the power supply device 100. Alternatively, a reference value for the SOC may be determined in advance, and a battery module 102 of which the SOC is equal to or higher than this reference value may be selected. However, the method of selecting the battery modules 102 is not limited to these examples, and any method that is effective in reducing imbalance in the SOC can be used.

In step S24, it is determined whether the electric power output of the power supply device 100 is in a powering state or a regenerating state. The full-charge-capacity estimating device 200 determines, from the direction of the current detected by the current sensor 32, whether the power supply device 100 is in the powering state in which electric power is supplied from the power supply device 100 to a load or in the regenerating state in which electric power is input from an external power source into the power supply device 100. The full-charge-capacity estimating device 200 moves to step S26 if the power supply device 100 is in the regenerating state, and ends the process if the power supply device 100 is in the powering state.

In step S26, the process of forcibly isolating the battery module 102 is performed. The full-charge-capacity estimating device 200 outputs a low (L)-level forced disconnection signal to the AND element 22 of the battery module 102 selected in step S22. As a result, the selected battery module 102 is forcibly isolated from the series connection and stops being supplied with regenerated electric power to the power supply device 100.

This control can resolve imbalance in the SOC as an amount of electric power supplied to a battery module 102 with a relatively high SOC among the battery modules 102 included in the power supply device 100 (an integrated amount of charged current per unit time) is reduced. As a result, all the battery modules 102 included in the power supply device 100 can be charged in a well-balanced manner. Moreover, excessive charging of a battery module 102 with a small charge capacity can be prevented.

Forced Connection Control

Next, control of forcibly connecting a selected one or selected ones of the battery modules 102 (102a, 102b, . . . 102n) will be described. The full-charge-capacity estimating device 200 outputs a high (H)-level forced connection signal to the OR element 24 of the battery module 102 to be forcibly connected.

As a result, a high (H) level is output from the OR element 24, a low (L) level is input into the gate terminal of the first switch element 16 by the NOT element 26, and a high (H) level is input into the gate terminal of the second switch element 18. Thus, the first switch element 16 is put in a normally off state and the second switch element 18 is put in a normally on state, which puts the battery module 102 in a state of being forcibly linked to the series connection regardless of the state of the gate signal.

Figure 7:
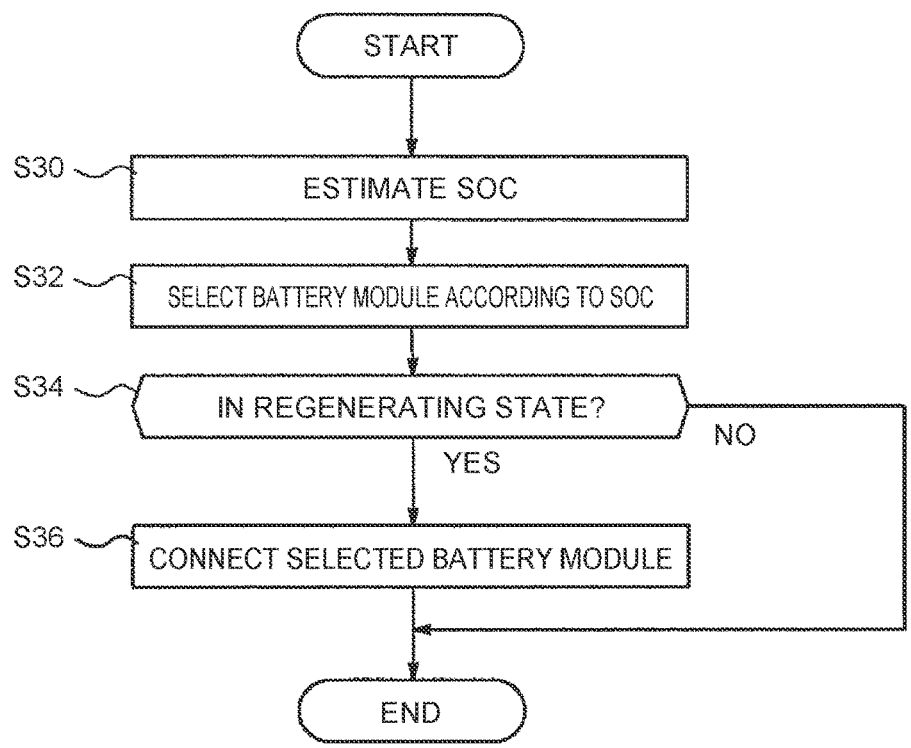
FIG. 7 is a flowchart of forced connection control in a regenerating state in the embodiment of the present disclosure.

Such forced connection control can be used as control for reducing imbalance in the SOC among the battery modules 102 in the power supply device 100. FIG. 7 is a flowchart of SOC balance adjusting control. In the following, control for reducing imbalance in the SOC among the battery modules 102 in a regenerating state will be described with reference to FIG. 7.

In step S30, the states-of-charge of all the battery modules 102 included in the power supply device 100 are estimated. The full-charge-capacity estimating device 200 performs a process of estimating the SOC of each battery module 102 based on outputs from the voltage sensor 30 that is provided in each battery module 102 and detects and outputs an output voltage of the battery module 102, the current sensor 32 that detects and outputs an output current of the power supply device 100, and the voltage sensor 34 that detects and outputs an output voltage of the power supply device 100. The process of estimating the SOC will be described later.

In step S32, the states-of-charge of the battery modules 102 are compared and a battery module 102 with a relatively low SOC is selected. The full-charge-capacity estimating device 200 compares the states-of-charge of the battery modules 102 estimated in step S30, and selects a battery module 102 with a relatively low SOC from all the battery modules 102. Specifically, this process can be performed in the same manner as the process in step S12 described above.

In step S34, it is determined whether the electric power output of the power supply device 100 is in a powering state or a regenerating state. The full-charge-capacity estimating device 200 determines, from the direction of the current detected by the current sensor 32, whether the power supply device 100 is in the powering state in which electric power is supplied from the power supply device 100 to a load or in the regenerating state in which electric power is input from an external power source into the power supply device 100. The full-charge-capacity estimating device 200 moves to step S36 if the power supply device 100 is in the regenerating state, and ends the process if the power supply device 100 is in the powering state.

In step S36, the process of forcibly connecting the battery module 102 is performed. The full-charge-capacity estimating device 200 outputs a high (H)-level forced connection signal to the OR element 24 of the battery module 102 selected in step S32. As a result, the selected battery module 102 is forcibly connected in series and starts contributing to charging of the power supply device 100 with regenerated electric power.

This control can resolve the imbalance in the SOC as a battery module 102 with a relatively low SOC among the battery modules 102 included in the power supply device 100 is preferentially charged with regenerated electric power and the integrated amount of discharged current per unit time is increased. As a result, all the battery modules 102 included in the power supply device 100 can be charged in a well-balanced manner.

The control for resolving imbalance in the SOC can also be performed while the power supply device 100 is in the powering state and not in the regenerating state. In this case, control of forcibly connecting a battery module 102 with a relatively high SOC is performed, and the amount of electric power consumed in the battery module 102 with a relatively high SOC is increased, to thereby resolve imbalance in the SOC.

Figure 8:
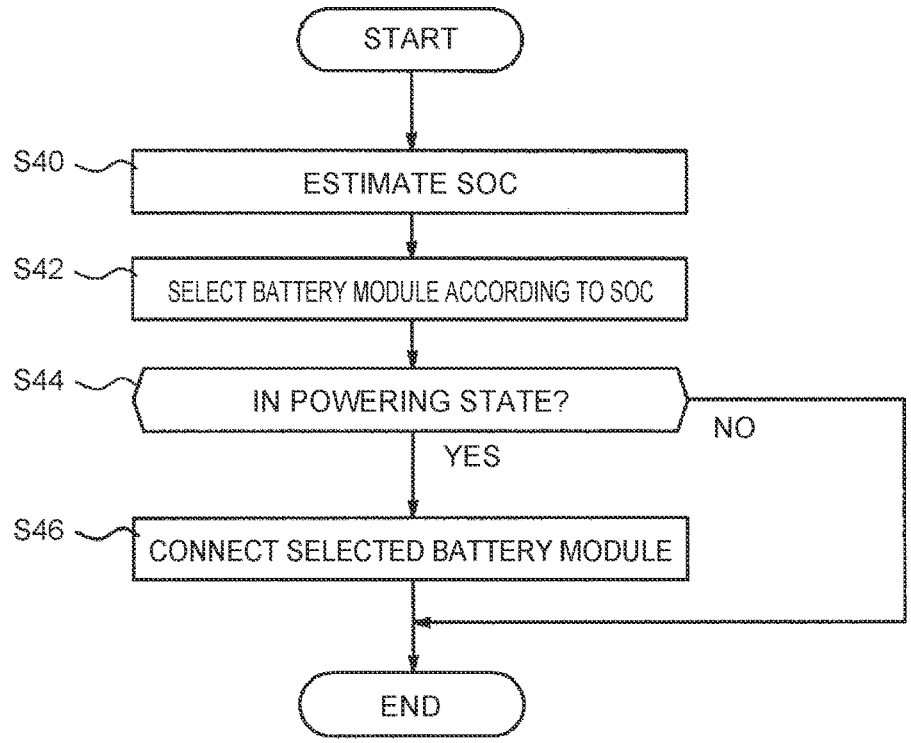
FIG. 8 is a flowchart of forced connection control in a powering state in the embodiment of the present disclosure.

FIG. 8 is a flowchart of SOC balance adjusting control. In the following, control for reducing imbalance in the SOC among the battery modules 102 in the powering state will be described with reference to FIG. 8.

In step S40, the states-of-charge of all the battery modules 102 included in the power supply device 100 are estimated. The full-charge-capacity estimating device 200 performs a process of estimating the SOC of each battery module 102 based on outputs from the voltage sensor 30 that is provided in each battery module 102 and detects and outputs an output voltage of the battery module 102, the current sensor 32 that detects and outputs an output current of the power supply device 100, and the voltage sensor 34 that detects and outputs an output voltage of the power supply device 100. The process of estimating the SOC will be described later.

In step S42, the states-of-charge of the battery modules 102 are compared and a battery module 102 with a relatively high SOC is selected. The full-charge-capacity estimating device 200 compares the states-of-charge of the battery modules 102 estimated in step S40, and selects a battery module 102 with a relatively high SOC from all the battery modules 102. Specifically, this process can be performed in the same manner as in step S22 described above.

In step S44, it is determined whether the electric power output of the power supply device 100 is in a powering state or a regenerating state. The full-charge-capacity estimating device 200 determines, from the direction of the current detected by the current sensor 32, whether the power supply device 100 is in the powering state in which electric power is supplied from the power supply device 100 to a load or in the regenerating state in which electric power is input from an external power source into the power supply device 100. The full-charge-capacity estimating device 200 moves to step S46 if the power supply device 100 is in the powering state, and ends the process if the power supply device 100 is in the regenerating state.

In step S46, the process of forcibly connecting the battery module 102 is performed. The full-charge-capacity estimating device 200 outputs a high (H)-level forced connection signal to the OR element 24 of the battery module 102 selected in step S42. As a result, the selected battery module 102 is forcibly connected in series and starts contributing to supplying electric power from the power supply device 100.

This control can resolve imbalance in the SOC as an amount of electric power supplied from a battery module 102 with a relatively high SOC among the battery modules 102 included in the power supply device 100 (an integrated amount of discharged current per unit time) is increased. As a result, energy charged to all the battery modules 102 included in the power supply device 100 can be efficiently used up.

Full-Charge-Capacity Estimation Process

Figure 9:
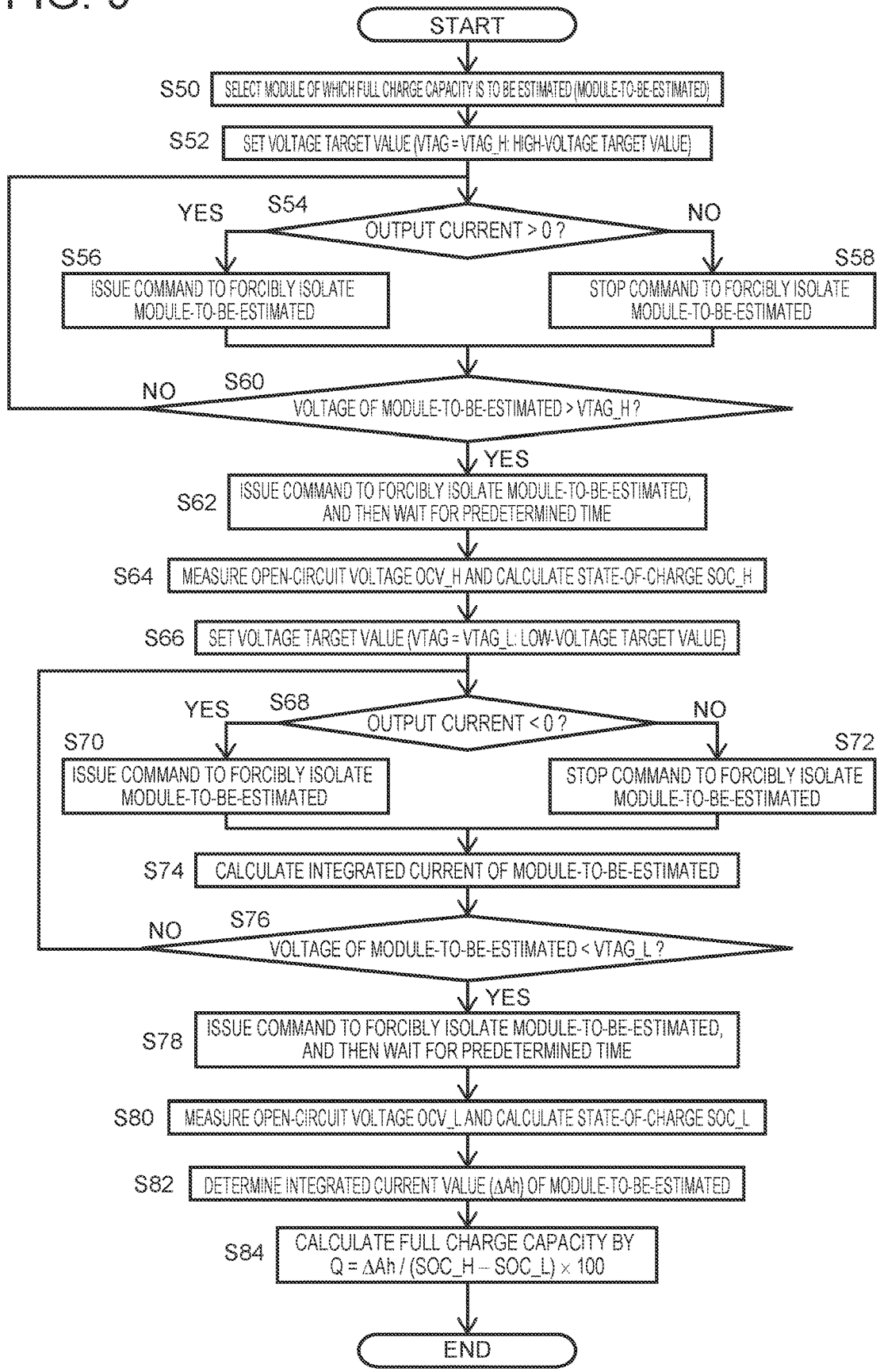
FIG. 9 is a flowchart of a full-charge-capacity estimation method in the embodiment of the present disclosure.

A process of estimating the full charge capacity of the power supply device 100 performed by the full-charge-capacity estimating device 200 will be described below. FIG. 9 is a flowchart of the full-charge-capacity estimation process in this embodiment.

In step S50, a battery module 102 of which the full charge capacity is to be estimated is selected from the battery modules 102 included in the power supply device 100. As a method to select a battery module 102, for example, all the battery modules 102 may be sequentially selected and the full charge capacity of each battery module 102 may be estimated. Alternatively, for example, when a battery module 102 in the power supply device 100 is replaced with a new one, the new battery module 102 may be selected and the full charge capacity thereof may be estimated. Either one or a plurality of battery modules 102 may be selected as battery-modules-to-be-measured 102.

In step S52, a high-voltage target value VTAG_H is set as a voltage target value VTAG The high-voltage target value VTAG_H is a voltage value serving as a target in charging the battery-module-to-be-measured 102.

In step S54, it is determined whether the power supply device 100 is in a powering state or a regenerating state. The full-charge-capacity estimating device 200 determines whether or not the output current of the power supply device 100 is larger than zero by means of the current sensor 32. The full-charge-capacity estimating device 200 moves to step S56 if the output current is larger than zero (the power supply device 100 is in a powering state), and moves to step S58 if the output current is equal to or smaller than zero (the power supply device 100 is in a regenerating state).

In step S56, control is performed so as to forcibly isolate the battery-module-to-be-measured 102. The full-charge-capacity estimating device 200 outputs a low (L)-level forced disconnection signal to the AND element 22 of the battery-module-to-be-measured 102, and outputs a low (L)-level forced connection signal to the OR element 24 of this battery-module-to-be-measured 102 As a result, the battery-module-to-be-measured 102 is put in a state of being forcibly isolated regardless of the state of the gate signal (pass-through state), so that no current is discharged from this battery-module-to-be-measured 102 while the power supply device 100 is in a powering state.

In step S58, control is performed so as not to forcibly isolate the battery-module-to-be-measured 102. The full-charge-capacity estimating device 200 outputs a high (H)-level forced disconnection signal to the AND element 22 of the battery-module-to-be-measured 102, and outputs a low (L)-level forced connection signal to the OR element 24 of this battery-module-to-be-measured 102. As a result, the battery-module-to-be-measured 102 is put in a state of being connected or disconnected according to the state of the gate signal, so that electric power is charged to this battery-module-to-be-measured 102 while the power supply device 100 is in a regenerating state.

In step S60, it is determined whether or not the output voltage of the battery-module-to-be-measured 102 has exceeded the voltage target value VTAG (=high-voltage target value VTAG_H). The full-charge-capacity estimating device 200 moves to step S62 if the measurement value of the voltage sensor 30 of the battery-module-to-be-measured 102 is larger than the voltage target value VTAG (=high-voltage target value VTAG_H), and moves back to step S54 if not.

Figure 10:
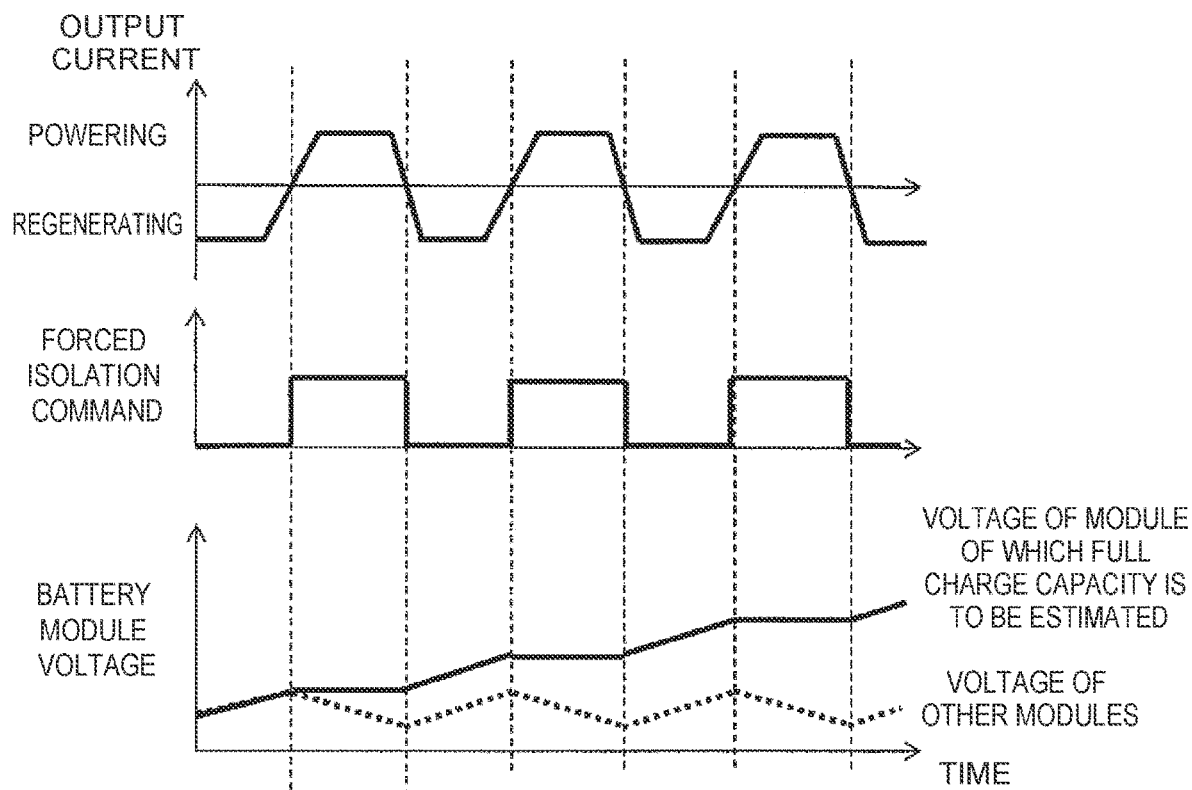
FIG. 10 is a graph showing a charge-discharge state of a battery module of which the full charge capacity is to be estimated in the embodiment of the present disclosure.

Thus, the process in steps S54 to S58 is repeated, so that, as shown in FIG. 10, when the power supply device 100 is in a powering state, the battery-module-to-be-measured 102 is not discharged, whereas when the power supply device 100 is in a regenerating state, the battery-module-to-be-measured 102 is charged. As shown in FIG. 10, the battery-module-to-be-measured 102 can be charged so as to raise the SOC thereof, even in a situation where the power supply device 100 as a whole is repeatedly charged and discharged and the states-of-charge of the battery modules 102 other than the battery-module-to-be-measured 102 do not change significantly.

In step S62, control is performed so as to forcibly isolate the battery-module-to-be-measured 102 and then wait for a predetermined time. The full-charge-capacity estimating device 200 outputs a low (L)-level forced disconnection signal to the AND element 22 of the battery-module-to-be-measured 102, and outputs a low (L)-level forced connection signal to the OR element 24 of this battery-module-to-be-measured 102. As a result, the battery-module-to-be-measured 102 is put in a state of being forcibly isolated regardless of the state of the gate signal (pass-through state). The full-charge-capacity estimating device 200 waits for a predetermined time in this state.

Figure 11:
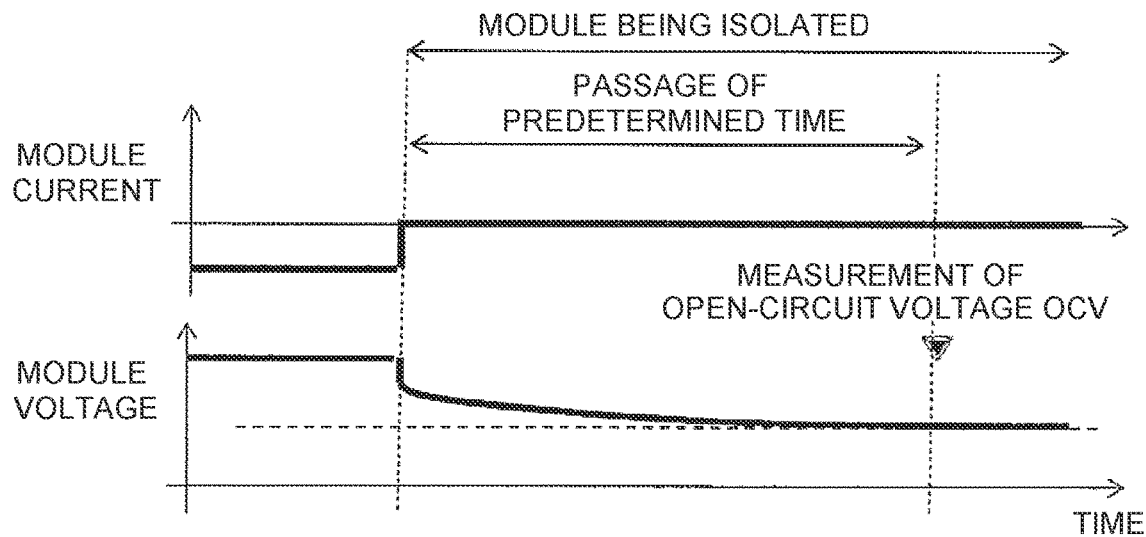
FIG. 11 is a graph illustrating a method of measuring an open-circuit voltage in the embodiment of the present disclosure.
Figure 12:
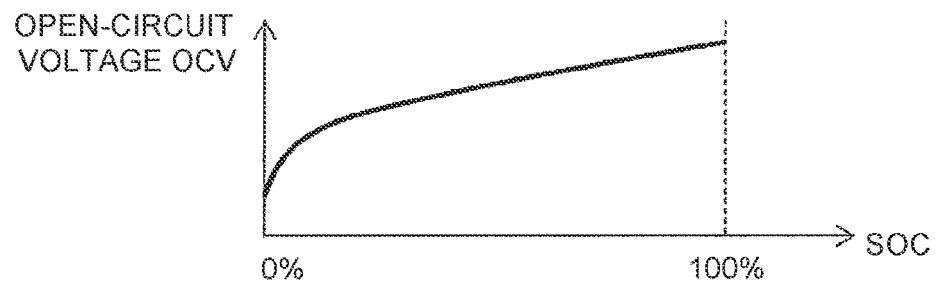
FIG. 12 is a graph showing a relation between a state-of-charge SOC and an open-circuit voltage OCV of the battery module.

In step S64, an open-circuit voltage OCV_H of the battery-module-to-be-measured 102 is measured, and a state-of-charge SOC_H corresponding to the open-circuit voltage OCV_H is obtained. Since the battery-module-to-be-measured 102 is kept in the forcibly isolated state for a predetermined time in step S62, as shown in FIG. 11, the open-circuit voltage of the battery-module-to-be-measured 102 becomes stable and the open-circuit voltage OCV_H can be measured with high accuracy. As shown in FIG. 12, a relation between an open-circuit voltage OCV and the SOC of the battery module 102 can be obtained and stored in a storage unit or the like in advance. By using this relation, the full-charge-capacity estimating device 200 obtains the state-of-charge SOC_H corresponding to the measured open-circuit voltage OCV_H. The relation between the open-circuit voltage OCV and the SOC of the battery module 102 may be stored as a database (map), or may be stored as a relational expression of the open-circuit voltage OCV and the SOC.

In step S66, a low-voltage target value VTAG_L is set as the voltage target value VTAG The low-voltage target value VTAG_L is a voltage value serving as a target in discharging the battery-module-to-be-measured 102.

In step S68, it is determined whether the power supply device 100 is in a regenerating state or a powering state. The full-charge-capacity estimating device 200 determines whether or not the output current of the power supply device 100 is smaller than zero by means of the current sensor 32. The full-charge-capacity estimating device 200 moves to step S70 if the output current is smaller than zero (the power supply device 100 is in a regenerating state), and moves to step S72 if the output current is equal to or larger than zero (the power supply device 100 is in a powering state).

In step S70, control is performed so as to forcibly isolate the battery-module-to-be-measured 102. The full-charge-capacity estimating device 200 outputs a low (L)-level forced disconnection signal to the AND element 22 of the battery-module-to-be-measured 102, and outputs a low (L)-level forced connection signal to the OR element 24 of this battery-module-to-be-measured 102. As a result, the battery-module-to-be-measured 102 is put in a state of being forcibly isolated regardless of the state of the gate signal (pass-through state), so that this battery-module-to-be-measured 102 is not charged while the power supply device 100 is in a regenerating state.

In step S72, control is performed so as not to forcibly isolate the battery-module-to-be-measured 102. The full-charge-capacity estimating device 200 outputs a high (H)-level forced disconnection signal to the AND element 22 of the battery-module-to-be-measured 102, and outputs a low (L)-level forced connection signal to the OR element 24 of this battery-module-to-be-measured 102. As a result, the battery-module-to-be-measured 102 is put in a state of being connected or disconnected according to the state of the gate signal, so that this battery-module-to-be-measured 102 is discharged while the power supply device 100 is in a powering state.

Figure 13:
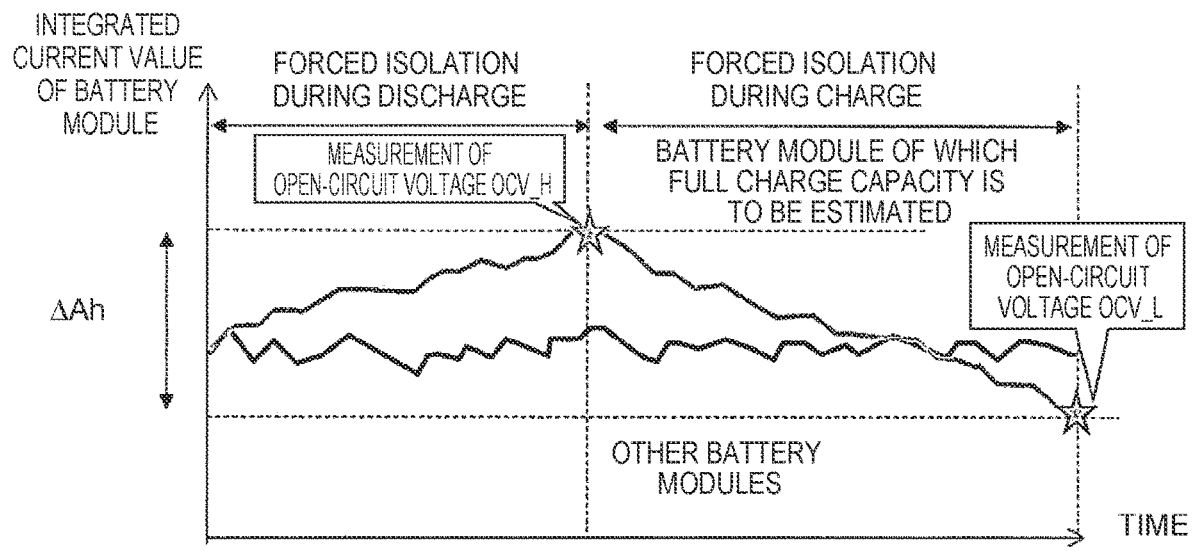
FIG. 13 is a graph showing an example of changes over time in an integrated current value of the battery module in the embodiment of the present disclosure.

In step S74, a process of integrating a current flowing through the battery-module-to-be-measured 102 is performed. The current flowing through the battery-module-to-be-measured 102 is smoothed by the filter. An average current Imod flowing through the battery-module-to-be-measured 102 can be expressed using the output current Iout of the power supply device 100 and a connection duty D of the battery module 102. Specifically, the average current Imod is zero when the battery module 102 is in a forcibly isolated state, and is equal to an output current Iout when the battery module 102 is in a forcibly connected state. When the battery module 102 is not in a forcibly isolated state, the average current Imod is obtained by the output current Iout×the connection duty D. It is therefore possible, as shown in FIG. 13, to obtain an integrated current value ΔAh of the current flowing through the battery-module-to-be-measured 102 by integrating these values according to the state of the battery-module-to-be-measured 102.

The connection duty D can be calculated by Formula (1) using the voltage Vmod of the battery module 102, a voltage Vmod_1 of the battery module 102 in a forcibly isolated state, and a voltage Vmod_2 of the battery module 102 in a forcibly connected state:

[Formula 1]

$$D = \frac{Vout - \sum Vmod\_2}{\sum Vmod - (\sum Vmod\_1 + \sum Vmod\_2)} \quad (1)$$

In step S76, it is determined whether or not the output voltage of the battery-module-to-be-measured 102 has become lower than the voltage target value VTAG (=low-voltage target value VTAG_L). The full-charge-capacity estimating device 200 moves to step S78 if the measured value of the voltage sensor 30 of the battery-module-to-be-measured 102 is smaller than the voltage target value VTAG (=low-voltage target value VTAG_L), and moves back to step S68 if not.

Thus, the process in steps S68 to S74 is repeated, so that when the power supply device 100 is in a regenerating state, the battery-module-to-be-measured 102 is not charged, whereas when the power supply device 100 is in a powering state, the battery-module-to-be-measured 102 is discharged. Therefore, the battery-module-to-be-measured 102 can be discharged so as to reduce the SOC thereof, even in a situation where the power supply device 100 as a whole is repeatedly charged and discharged and the states-of-charge of the battery modules 102 other than the battery-module-to-be-measured 102 do not change significantly.

In step S78, control is performed so as to forcibly isolate the battery-module-to-be-measured 102 and then wait for a predetermined time. The full-charge-capacity estimating device 200 performs control in the same manner as in step S62 described above, and waits for a predetermined time in a state where the battery-module-to-be-measured 102 is forcibly isolated.

In step S80, an open-circuit voltage OCV_L of the battery-module-to-be-measured 102 is measured, and a state-of-charge SOC_L corresponding to the open-circuit voltage OCV_L is obtained. Since the battery-module-to-be-measured 102 is kept in the forcibly isolated state for a predetermined time in step S78, the open-circuit voltage of the battery-module-to-be-measured 102 becomes stable and the open-circuit voltage OCV_L can be measured with high accuracy. The full-charge-capacity estimating device 200 obtains the state-of-charge SOC_L corresponding to the measured open-circuit voltage OCV_L.

In step S82, the integrated current value ΔAh of the battery-module-to-be-measured 102 is determined. The full-charge-capacity estimating device 200 determines the integrated current value ΔAh of each battery-module-to-be-measured 102 that has been obtained by repeatedly performing integration in step S74.

Figure 14:
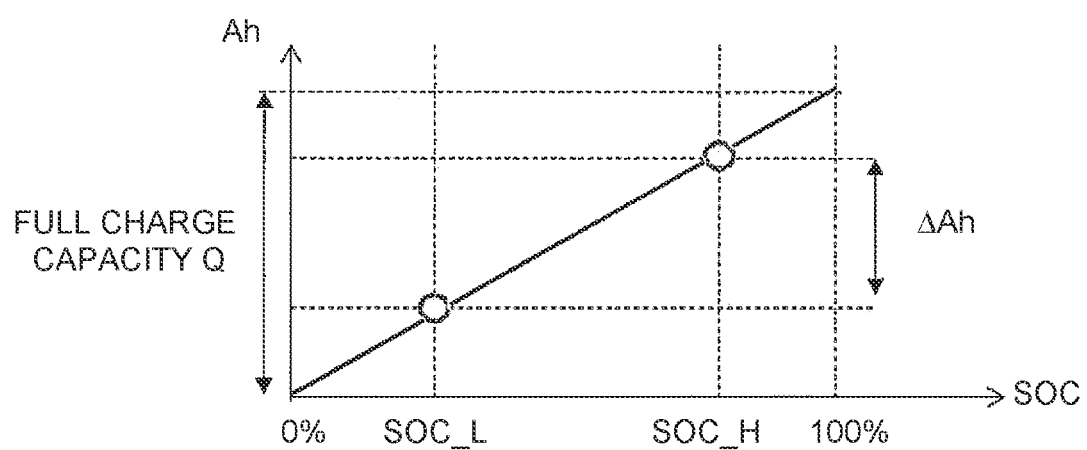
FIG. 14 is a graph illustrating a method of estimating a full charge capacity Q of the battery module in the embodiment of the present disclosure.

In step S84, a full charge capacity Q of the battery-module-to-be-measured 102 is obtained. As shown in FIG. 14, the full charge capacity Q can be estimated from the relation between the integrated current value ΔAh and a change in the state-of-charge ΔSOC that is the difference between the state-of-charge SOC_H and the state-of-charge SOC_L. Specifically, the full-charge-capacity estimating device 200 estimates the full charge capacity Q of each battery-module-to-be-measured 102 by using Formula (2):

[Formula 2]

$$Q = \Delta Ah \times \frac{100}{SOC\_H - SOC\_L} \quad (2)$$

The method to estimate the full charge capacity is not limited to the calculation method using Formula (2), and for example, a method using a battery model described in Japanese Patent No. 4649682 may also be used.

In this embodiment, the full charge capacity is estimated by performing the control of forcibly isolating the battery-module-to-be-measured 102 according to the state of the power supply device 100. However, it is also possible to estimate the full charge capacity by performing control of forcibly connecting the battery-module-to-be-measured 102 according to the state of the power supply device 100

Specifically, to raise the state-of-charge SOC of the battery-module-to-be-measured 102, the battery-module-to-be-measured 102 is put in a forcibly connected state when the power supply device 100 is in a regenerating state and put under normal control when the power supply device 100 is in a powering state. To reduce the state-of-charge SOC of the battery-module-to-be-measured 102, the battery-module-to-be-measured 102 is put under normal control when the power supply device 100 is in a regenerating state and put in a forcibly connected state when the power supply device 100 is in a powering state. This control causes the state-of-charge SOC of the battery-module-to-be-measured 102 to change more significantly than the states-of-charge of the other battery modules 102, which allows the full charge capacity Q to be estimated by using Formula (2), from the relation between the integrated current value ΔAh and the resulting state-of-charge SOC_H and state-of-charge SOC_L.

What is claimed is:

1. A full-charge-capacity estimating device for a power supply device that includes a plurality of battery modules each having a secondary battery, the battery modules being connected in series with one another according to a gate signal, the power supply device including a disconnecting device that forcibly isolates a battery module of the plurality of battery modules from the series connection regardless of the gate signal, the full-charge-capacity estimating device being configured to:
   (i) control the disconnecting device to cause one or more of the battery modules to be charged or discharged, as a battery-module-to-be-measured, depending on whether the power supply device is in a powering state or a regenerating state;
   (ii) measure an integrated current value and a change in a state-of-charge of the battery-module-to-be-measured; and
   (iii) estimate a full charge capacity of the battery-module-to-be-measured from the integrated current value and the change in the state-of-charge that were measured.

2. The full-charge-capacity estimating device according to claim 1, wherein, while the power supply device is in the powering state, the full-charge-capacity estimating device controls the disconnecting device to forcibly isolate the battery-module-to-be-measured from the series connection so that the battery-module-to-be-measured has a smaller integrated amount of discharged current per unit time than remaining ones of the battery modules.

3. The full-charge-capacity estimating device according to claim 1, wherein, while the power supply device is in the regenerating state, the full-charge-capacity estimating device controls the disconnecting device to forcibly isolate the battery-module-to-be-measured from the series connection so that the battery-module-to-be-measured has a smaller integrated amount of charged current per unit time than remaining ones of the battery modules.

4. The full-charge-capacity estimating device according to claim 1, wherein, to measure the change in the state-of-charge corresponding to the integrated current value, the full-charge-capacity estimating device measures an open-circuit voltage of the battery-module-to-be-measured and obtains the change in the state-of-charge corresponding to the open-circuit voltage.

5. The full-charge-capacity estimating device according to claim 1, wherein:
   each of the battery modules has a plurality of the secondary batteries;
   (A) the full-charge-capacity estimating device measures a first state of charge (SOC_H) of the battery-module-to-be-measured by:
      (A1) controlling the disconnecting device to forcibly isolate the secondary batteries included in the battery-module-to-be-measured from the series connection when the power supply device is in the powering state and controlling the disconnecting device to not forcibly isolate the secondary batteries included in the battery-module-to-be-measured from the series connection when the power supply device is in the regenerating state until an output voltage of the battery-module-to-be-measured is greater than a first predetermined voltage;
      (A2) when the output voltage of the battery-module-to-be-measured becomes greater than the first predetermined voltage, controlling the disconnecting device to forcibly isolate the secondary batteries included in the battery-module-to-be-measured from the series connection and measuring a first open-circuit voltage (OCV_H) of the battery-module-to-be-measured; and
      (A3) determining the first state of charge (SOC_H) from the first open-circuit voltage (OCV_H) that was measured;
   (B) the full-charge-capacity estimating device measures a second state of charge (SOC_L) of the battery-module-to-be-measured by:
      (B1) controlling the disconnecting device to forcibly isolate the secondary batteries included in the battery-module-to-be-measured from the series connection when the power supply device is in the regenerating state and controlling the disconnecting device to not forcibly isolate the secondary batteries included in the battery-module-to-be-measured from the series connection when the power supply device is in the powering state until the output voltage of the battery-module-to-be-measured is less than a second predetermined voltage;
      (B2) when the output voltage of the battery-module-to-be-measured becomes less than the second predetermined voltage, controlling the disconnecting device to forcibly isolate the secondary batteries included in the battery-module-to-be-measured from the series connection and measuring a second open-circuit voltage (OCV_L) of the battery-module-to-be-measured; and
      (B3) determining the second state of charge (SOC_L) from the second open-circuit voltage (OCV_L) that was measured; and
   (C) the full-charge-capacity estimating device estimates the full charge capacity of the battery-module-to-be-measured from a relationship between the integrated current value, the first state of charge (SOC_H) and the second state of charge (SOC_L) of the battery-module-to-be-measured.

6. A full-charge-capacity estimating device for a power supply device that includes a plurality of battery modules each having a secondary battery, the battery modules being connected in series with one another according to a gate signal, the power supply device including a connecting device that forcibly connects a battery module of the plurality of battery modules to the series connection regardless of the gate signal, the full-charge-capacity estimating device being configured to:
  (i) control the connecting device to cause one or more of the battery modules to be charged or discharged, as a battery-module-to-be-measured, depending on whether the power supply device is in a powering state or a regenerating state;
  (ii) measure an integrated current value and a change in a state-of-charge of the battery-module-to-be-measured; and
  (iii) estimate a full charge capacity of the battery-module-to-be-measured from the integrated current value and the change in the state-of-charge that were measured.

7. The full-charge-capacity estimating device according to claim 6, wherein, while the power supply device is in the regenerating state, the full-charge-capacity estimating device controls the connecting device to forcibly connect the battery-module-to-be-measured to the series connection so that the battery-module-to-be-measured has a larger integrated amount of charged current per unit time than remaining ones of the battery modules.

8. The full-charge-capacity estimating device according to claim 6, wherein, while the power supply device is in the powering state, the full-charge-capacity estimating device controls the connecting device to forcibly connect the battery-module-to-be-measured to the series connection so that the battery-module-to-be-measured has a larger integrated amount of discharged current per unit time than remaining ones of the battery modules.

9. The full-charge-capacity estimating device according to claim 6, wherein:
  each of the battery modules has a plurality of the secondary batteries;
  (A) the full-charge-capacity estimating device measures a first state of charge (SOC_H) of the battery-module-to-be-measured by:
    (A1) controlling the connecting device to forcibly connect the secondary batteries included in the battery-module-to-be-measured to the series connection when the power supply device is in the regenerating state and controlling the connecting device to not forcibly connect the secondary batteries included in the battery-module-to-be-measured to the series connection when the power supply device is in the powering state until an output voltage of the battery-module-to-be-measured is greater than a first predetermined voltage;
    (A2) when the output voltage of the battery-module-to-be-measured becomes greater than the first predetermined voltage, controlling the connecting device to forcibly connect the secondary batteries included in the battery-module-to-be-measured to the series connection and measuring a first open-circuit voltage (OCV_H) of the battery-module-to-be-measured; and
    (A3) determining the first state of charge (SOC_H) from the first open-circuit voltage (OCV_H) that was measured;
  (B) the full-charge-capacity estimating device measures a second state of charge (SOC_L) of the battery-module-to-be-measured by:
    (B1) controlling the connecting device to forcibly connect the secondary batteries included in the battery-module-to-be-measured to the series connection when the power supply device is in the powering state and controlling the connecting device to not forcibly connect the secondary batteries included in the battery-module-to-be-measured to the series connection when the power supply device is in the regenerating state until the output voltage of the battery-module-to-be-measured is less than a second predetermined voltage;
    (B2) when the output voltage of the battery-module-to-be-measured becomes less than the second predetermined voltage, controlling the connecting device to forcibly connect the secondary batteries included in the battery-module-to-be-measured to the series connection and measuring a second open-circuit voltage (OCV_L) of the battery-module-to-be-measured; and
    (B3) determining the second state of charge (SOC_L) from the second open-circuit voltage (OCV_L) that was measured; and
  (C) the full-charge-capacity estimating device estimates the full charge capacity of the battery-module-to-be-measured from a relationship between the integrated current value, the first state of charge (SOC_H) and the second state of charge (SOC_L) of the battery-module-to-be-measured.

* * * * *